United States Patent
Nonaka

(10) Patent No.: US 9,897,919 B2
(45) Date of Patent: Feb. 20, 2018

(54) SUBSTRATE LIQUID TREATMENT APPARATUS, SUBSTRATE LIQUID TREATMENT METHOD AND STORAGE MEDIUM

(71) Applicant: Tokyo Electron Limited, Tokyo (JP)

(72) Inventor: Jun Nonaka, Koshi-Shi (JP)

(73) Assignee: Tokyo Electron Limited, Minato-Ku (JP)

( * ) Notice: Subject to any disclaimer, the term of this patent is extended or adjusted under 35 U.S.C. 154(b) by 8 days.

(21) Appl. No.: 15/227,243

(22) Filed: Aug. 3, 2016

(65) Prior Publication Data

US 2017/0038688 A1 Feb. 9, 2017

(30) Foreign Application Priority Data

Aug. 7, 2015 (JP) ................. 2015-157723

(51) Int. Cl.
| | |
|---|---|
| *B05B 13/04* | (2006.01) |
| *B05C 11/02* | (2006.01) |
| *G03B 27/32* | (2006.01) |
| *G03C 5/18* | (2006.01) |
| *G03D 5/00* | (2006.01) |
| *G03F 7/16* | (2006.01) |
| *G03F 7/30* | (2006.01) |
| *H01L 21/67* | (2006.01) |

(52) U.S. Cl.
CPC ............... *G03F 7/16* (2013.01); *G03F 7/30* (2013.01); *H01L 21/67017* (2013.01)

(58) Field of Classification Search
CPC . G03F 7/16; G03F 7/30; G03F 7/3021; H01L 21/67017; H01L 21/67051

USPC .............. 118/52, 320; 355/27, 77; 396/611; 430/434

See application file for complete search history.

(56) References Cited

U.S. PATENT DOCUMENTS

| | | | | |
|---|---|---|---|---|
| 2015/0036109 A1* | 2/2015 | Yoshihara | ................. | G03F 7/30 355/27 |
| 2015/0036110 A1* | 2/2015 | Yoshihara | ............. | G03F 7/3021 355/27 |
| 2016/0062240 A1* | 3/2016 | Muta | ..................... | G03F 7/3021 430/434 |

FOREIGN PATENT DOCUMENTS

JP 2007-088381 A1 4/2007

* cited by examiner

*Primary Examiner* — Colin Kreutzer
(74) *Attorney, Agent, or Firm* — Burr & Brown, PLLC

(57) ABSTRACT

A substrate liquid treatment method includes: (a) rotating the substrate about the vertical axis; (b) supplying the treatment liquid to the rotating substrate from the second nozzle with a falling point of the treatment liquid supplied from the second nozzle moving from the central portion to the peripheral portion of the substrate, while supplying the treatment liquid to the central portion of the substrate from the first nozzle, (c) after (b), moving the second nozzle from the peripheral portion to the central portion of the substrate with the supplying of the treatment liquid from the second nozzle being stopped, while continuing supplying the treatment liquid to the central portion of the rotating substrate from the first nozzle; and (d) after (c), supplying the treatment liquid to the rotating substrate from the second nozzle.

15 Claims, 5 Drawing Sheets

SUBSTRATE LIQUID TREATMENT APPARATUS, SUBSTRATE LIQUID TREATMENT METHOD AND STORAGE MEDIUM

CROSS-REFERENCE TO RELATED APPLICATIONS

This application is based upon and claims the benefit of priority from Japanese Patent Application No. 2015-157723, filed on Aug. 7, 2015, the entire contents of which are incorporated herein by reference.

BACKGROUND OF THE INVENTION

Field of the Invention

The present invention relates to a technique for performing a liquid treatment to a substrate by supplying a treatment liquid to the substrate while rotating the substrate.

Background Art

Semiconductor fabrication processes include a step of forming a circuit pattern on a surface of a substrate such as a semiconductor wafer using photolithography. When dry etching is performed using a photoresist as an etch mask, reaction products called polymer is unavoidably adhered to the surface of the substrate. The polymers are removed in the next step.

The polymer removing process is performed by supplying a polymer removing liquid to the central portion of the substrate while rotating the substrate about a vertical axis. The polymer removing liquid is supplied under heated condition for enhanced reactivity. The substrate draws heat from the polymer removing liquid as it flows from the central portion to the peripheral portion of the substrate, so that the temperature of the polymer removing liquid lowers. The peripheral portion of the substrate is likely to be cooled because of the high circumferential speed thereof. Thus, the time required to remove the polymer at the peripheral portion of the substrate is longer than the central portion.

In order to achieve in-plane uniformity of the thermal condition, a scan discharge method is sometimes used. The scan discharge method moves a nozzle discharging the polymer removing liquid such that the falling point of the polymer removing liquid onto the substrate is moved between the central portion and the peripheral portion of the substrate. However, during the scan discharging, when the nozzle is positioned above the peripheral portion of the substrate, the polymer removing liquid covering the central portion of the substrate may be lost so that the central portion of the substrate is exposed to the substrate surrounding atmosphere (air atmosphere). This may results in generation of particles on the surface of the substrate.

Japanese Patent Laid-Open Publication No. 2007-088381A (Document 1) discloses a substrate liquid treatment apparatus having two nozzles mounted to one nozzle arm. The two nozzles moves along a circular arc passing through the center of the substrate in a plan view, by swinging the nozzle arm. The two nozzles mounted to the nozzle arm with the nozzles being separated at a distance of about one third of the diameter of the substrate. Document 1 recites that, by moving the arm while concurrently discharging the treatment liquid from the two nozzles, the whole surface of the substrate can be treated uniformly and the central portion of the substrate is prevented from being exposed to the substrate surrounding atmosphere.

However, in the apparatus of Document 1, the treatment liquid discharged from one nozzle located near the peripheral portion may disturb the flow of the treatment liquid having been discharged from the other nozzle located near the central portion and flowing toward the peripheral portion of the substrate. Under such a situation, substances having been removed from the substrate by the treatment liquid and flowing toward the peripheral portion of the substrate may be returned toward the central portion of the substrate, or may stagnate, so that the substances are not likely to flow out of the substrate and are likely to adhere to the substrate again.

SUMMARY OF THE INVENTION

The object of the present invention is to provide a liquid treatment technique in which the central portion of the substrate is not exposed to the substrate surrounding atmosphere and the treatment liquid supplied from a nozzle located on the peripheral portion side of the substrate does not disturb the flow of the treatment liquid having been supplied from a nozzle located on the central portion side of the substrate and flowing toward the peripheral portion of the substrate.

In one embodiment of the present invention, there is provided a substrate liquid treatment apparatus, which includes: a substrate holding unit that holds a substrate; a rotary driving unit that rotates the substrate holding unit about a vertical axis; a first nozzle that supplies a treatment liquid at least onto a central portion of the substrate held by the substrate holding unit; a second nozzle that supplies the treatment liquid onto the substrate held by the substrate holding unit; a first liquid supplying unit that supplies the treatment liquid to the first nozzle; a second liquid supplying unit that supplies the treatment liquid to the second nozzle; a second nozzle moving mechanism that moves the second nozzle between the central portion and a peripheral portion of the substrate held by the substrate holding unit; and a control unit that controls operations at least of the first liquid supplying unit, the second liquid supplying unit and the second nozzle moving mechanism, wherein the control unit is configured to: make the second nozzle move from the central portion toward the peripheral portion of the substrate while making the second nozzle supply the treatment liquid therefrom and while making the first nozzle supply therefrom the treatment liquid to the central portion of the substrate; thereafter make the second nozzle move from the peripheral portion toward the central portion of the substrate while making the second nozzle stop supplying the treatment liquid therefrom, while making the first nozzle supply the treatment liquid therefrom; and thereafter make the second nozzle start supplying the treatment liquid while making the first nozzle supply the treatment liquid therefrom.

In another embodiment of the present invention, there is provided a substrate liquid treatment method employing a substrate liquid treatment apparatus including: a substrate holding unit that holds a substrate; a rotary driving unit that rotates the substrate holding unit about an vertical axis; a first nozzle that supplies a treatment liquid at least onto a central portion of the substrate held by the substrate holding unit; a second nozzle that supplies the treatment liquid onto the substrate held by the substrate holding unit; a first liquid supplying unit that supplies the treatment liquid to the first nozzle; a second liquid supplying unit that supplies the treatment liquid to the second nozzle; and a second nozzle moving mechanism that moves the second nozzle between the central portion and a peripheral portion of the substrate held by the substrate holding unit, said substrate liquid treatment method including: (a) rotating the substrate about the vertical axis; (b) supplying the treatment liquid to the rotating substrate from the second nozzle with a falling point of the treatment liquid supplied from the second nozzle moving from the central portion to the peripheral portion of the substrate, while supplying the treatment liquid to the central portion of the substrate from the first nozzle; (c) after (b), moving the second nozzle from the peripheral portion to the central portion of the substrate with the supplying of the treatment liquid from the second nozzle being stopped, while continuing supplying the treatment liquid to the central portion of the rotating substrate from the first nozzle; and (d) after (c), supplying the treatment liquid to the rotating substrate from the second nozzle.

In yet another embodiment of the present invention, there is provided a non-transitory storage medium storing a program configured such that, upon execution of which by a computer for controlling operations of a substrate liquid treatment apparatus, the computer controls the substrate liquid treatment apparatus to perform the foregoing substrate liquid treatment method.

According to the foregoing embodiments, when one nozzle is supplying the treatment liquid to the central portion of the substrate, the falling point of the treatment liquid supplied (discharged) from the other nozzle may be moved from the central portion toward the peripheral portion of the substrate, but may not be moved toward the reverse direction. Thus, the treatment liquid having been supplied from the one nozzle and going toward the peripheral portion of the substrate is not blocked or pushed back toward the central portion of the substrate by the treatment liquid supplied from the other nozzle.

DETAILED DESCRIPTION OF THE INVENTION

Figure 1:
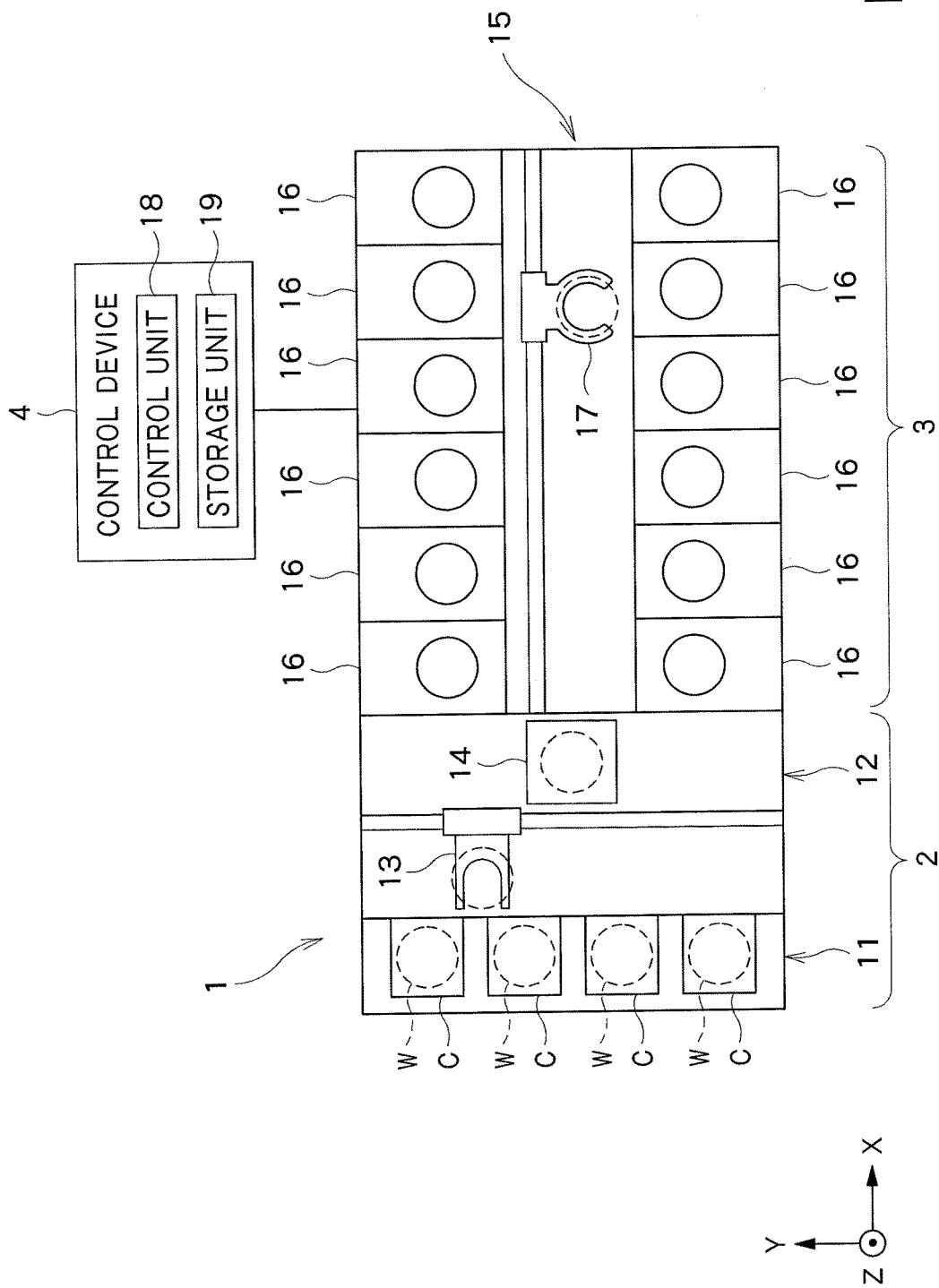
FIG. 1 is a top plan view showing a schematic configuration of a substrate processing system in one embodiment of a substrate liquid treatment apparatus according to the present invention.

FIG. 1 is a plan view illustrating an outline of a substrate processing system (i.e., a substrate liquid treatment apparatus) provided with a treatment unit (processing unit) according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a transfer section 12. In the carrier placing section 11, a plurality of carriers C are placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of treatment units 16. The plurality of treatment units 16 are arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the treatment units 16 by using the wafer holding mechanism.

The treatment units 16 performs a predetermined substrate processing on the wafers W transferred by the substrate transfer device 17.

Further, the liquid processing system 1 is provided with a control device 4. The control device 4 is, for example, a computer, and includes a control unit 18 and a storage unit 19. The storage unit 19 stores a program that controls various processings (treatments) performed in the liquid processing system 1. The control unit 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into the treatment unit 16.

The wafer W carried into the treatment unit 16 is processed (treated) by the treatment unit 16, and then, carried out from the treatment unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
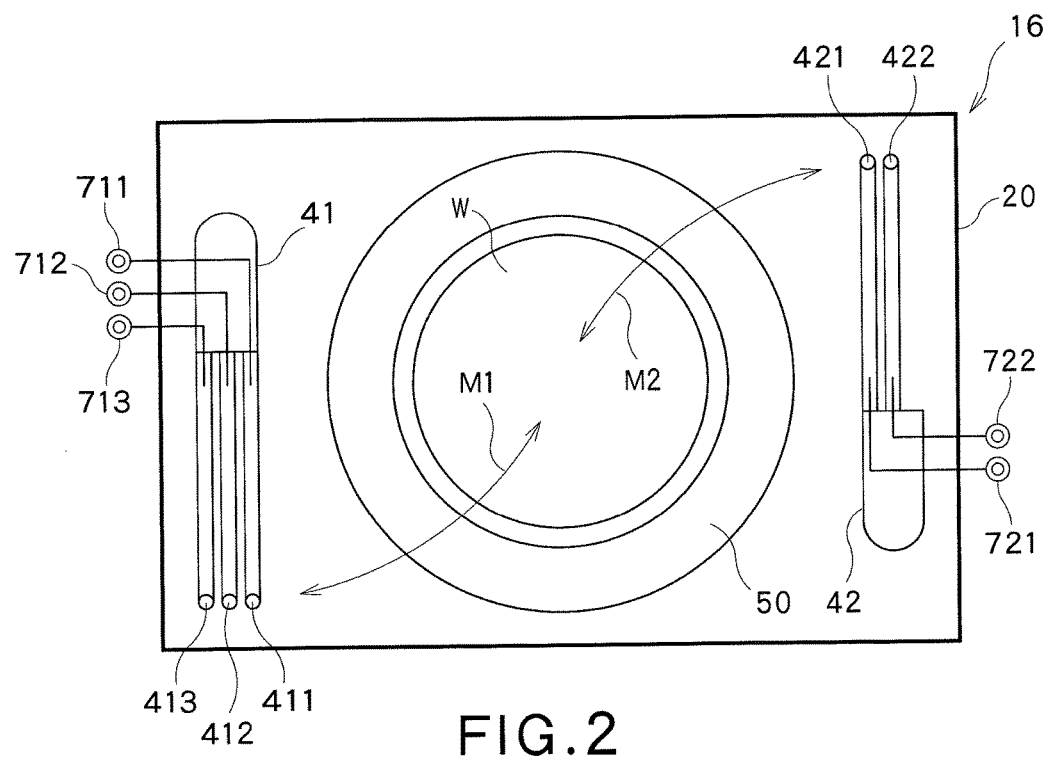
FIG. 2 is a schematic top plan view of a treatment unit (a liquid treatment unit) included in the substrate processing system shown in FIG. 1.
Figure 3:
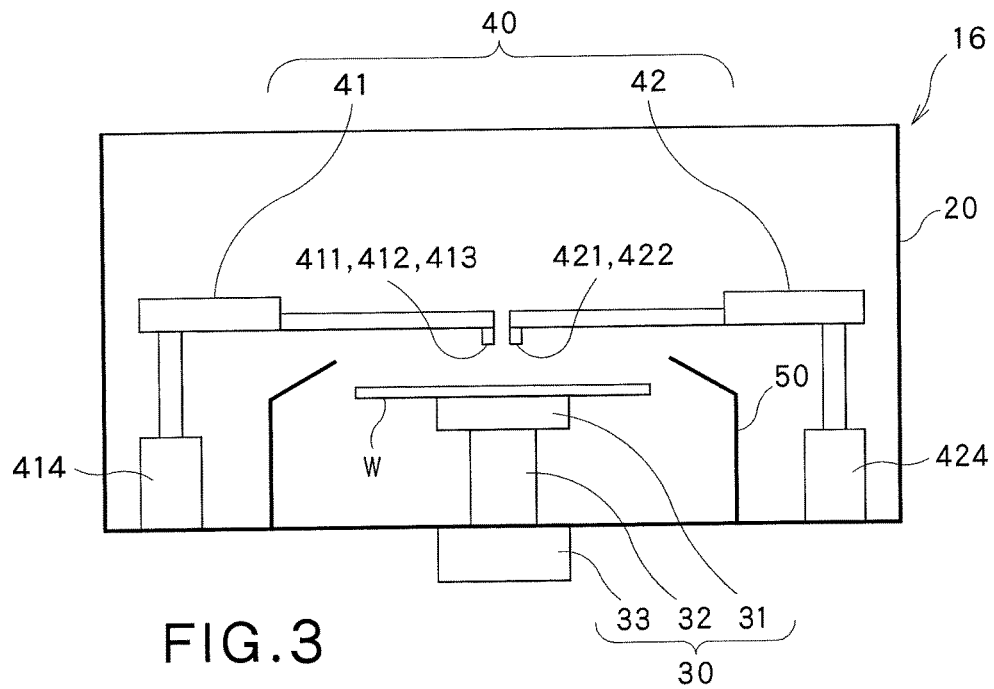
FIG. 3 is a schematic vertical cross sectional view of the treatment unit shown in FIG. 2.
Figure 4A:
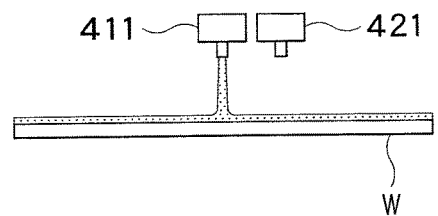
FIGS. 4A to 4E are explanatory diagrams for explaining the operation of the treatment liquid nozzles in a polymer removing step.
Figure 4B:
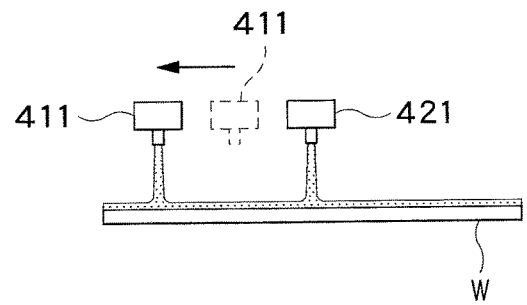
Figure 4C:
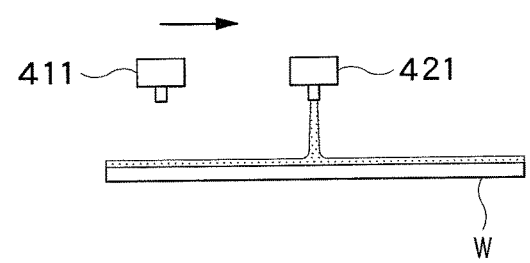
Figure 4D:
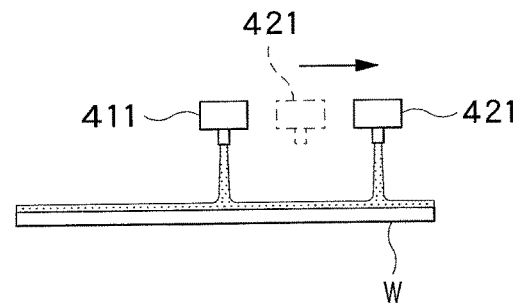
Figure 4E:
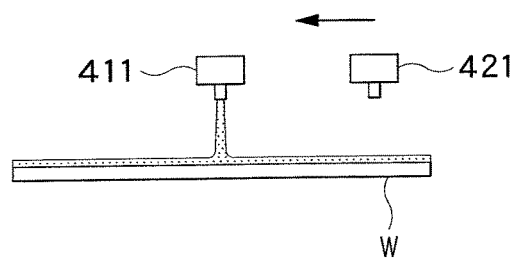

Next, a schematic structure of the treatment unit 16 is described with reference to FIGS. 2 and 3.

The treatment unit 16 includes a chamber (treatment unit housing) 20. In the chamber 20, there are provided a substrate holding mechanism 30, a treatment fluid supplying unit 40 and a cup 50.

The substrate holding mechanism 30 is provided with a holding unit 31, a rotating shaft 32 and a driving unit 33. The holding unit 31 is capable of holding a wafer W horizontally. The driving unit 33 rotates the holding unit 31 through the rotating shaft 32, so that the wafer W held on the holding unit 31 is rotated about a vertical axis.

The treatment fluid supplying unit 40 includes a first nozzle arm 41 (first nozzle moving mechanism) and a second nozzle arm 42 (second nozzle moving mechanism).

The first nozzle arm 41 is provided at its distal end with a first treatment liquid nozzle 411 that discharges a polymer removing liquid (chemical liquid) as a treatment liquid, and a rinse nozzle 412 that discharges DIW (deionized water) as a rinse liquid, and a solvent nozzle 413. The solvent nozzle 413 discharges an organic solvent, such as IPA (isopropyl alcohol) in the illustrated embodiment, which is compatible with DIW, and has a surface tension lower than that of DIW and volatility higher than that of DIW.

The second nozzle arm 42 is provided at its distal end with a second treatment liquid nozzle 421 that discharges a polymer removing liquid (which is the same as the polymer removing liquid to be discharged from the first treatment liquid nozzle 421) as a treatment liquid, and a dry gas nozzle 422. The dry gas nozzle 422 discharges a gas having a humidity lower than that of air in the clean room (preferably a gas having a humidity and an oxygen concentration that are lower than those of air in the clean room), which is nitrogen gas in the illustrated embodiment.

The first nozzle arm 41 is turnable about a vertical axis (see arrow M1 in FIG. 2) and movable vertically, by an arm driving mechanism 414. By turning the first nozzle arm 41, the nozzles 411, 412 and 413 provided on the first nozzle arm 41 can be located at any position between a position above the central portion of a wafer W (or a position right above the center of the wafer W) and a position above a peripheral portion of the wafer W.

The second nozzle arm 42 is turnable about a vertical axis (see arrow M2 in FIG. 2) and movable vertically, by an arm driving mechanism 424. By turning the second nozzle arm 42, the nozzles 421 and 422 provided on the second nozzle arm 42 can be located at any position between a position above the central portion of a wafer W (or a position right above the center of the wafer W) and a position above a peripheral portion of the wafer W.

The first and second nozzle arms 41 and 42 may be of a linear motion type that moves linearly and translationally in the horizontal direction, instead of the swing motion type as illustrated.

The liquid receiving cup 50 surrounds the substrate holding mechanism 30 so as to collect a liquid that has been supplied onto a rotating wafer W from the nozzles 411, 412, 413 and 421 and then spun off from the wafer W.

Each nozzle (411, 412, 413, 421, 422) is supplied with a treatment fluid (liquid or gas) from a corresponding treatment fluid supplying unit (i.e., a first treatment liquid supplying unit 711, a rinse liquid supplying unit 712, a solvent supplying unit 713, a second treatment liquid supplying unit 721, a dry gas supplying unit 722). Although not shown, each treatment fluid supplying unit is composed of: a treatment fluid supplying source formed of a tank, a gas cylinder or a factory supplying source; a treatment fluid line connecting the treatment liquid supplying source and a corresponding nozzle; and a flowrate regulating equipment provided in the treatment fluid line, such as an on-off valve and/or a flowrate regulating valve.

Since the polymer removing liquid is supplied under heated condition to a wafer W, the treatment liquid supplying units 711 and 712 for the first and the second treatment liquid nozzles 411 and 422 and the corresponding treatment fluid lines are equipped with a heater or a heat insulating material (both of which are not shown).

Next, an operation of the treatment unit 16 is described with reference to FIGS. 4A to 4E and FIG. 5, as well as FIG. 2 and FIG. 3. The operation of the treatment unit 16 described hereinbelow is automatically performed under the control of the control unit 18 of the control device 4, which controls various constituent elements (nozzle arms, treatment fluid supplying units and so on), upon execution of control programs stored in the storage unit 19 (see FIG. 1) referring to a treatment recipe stored in the storage unit 19.

Figure 5:
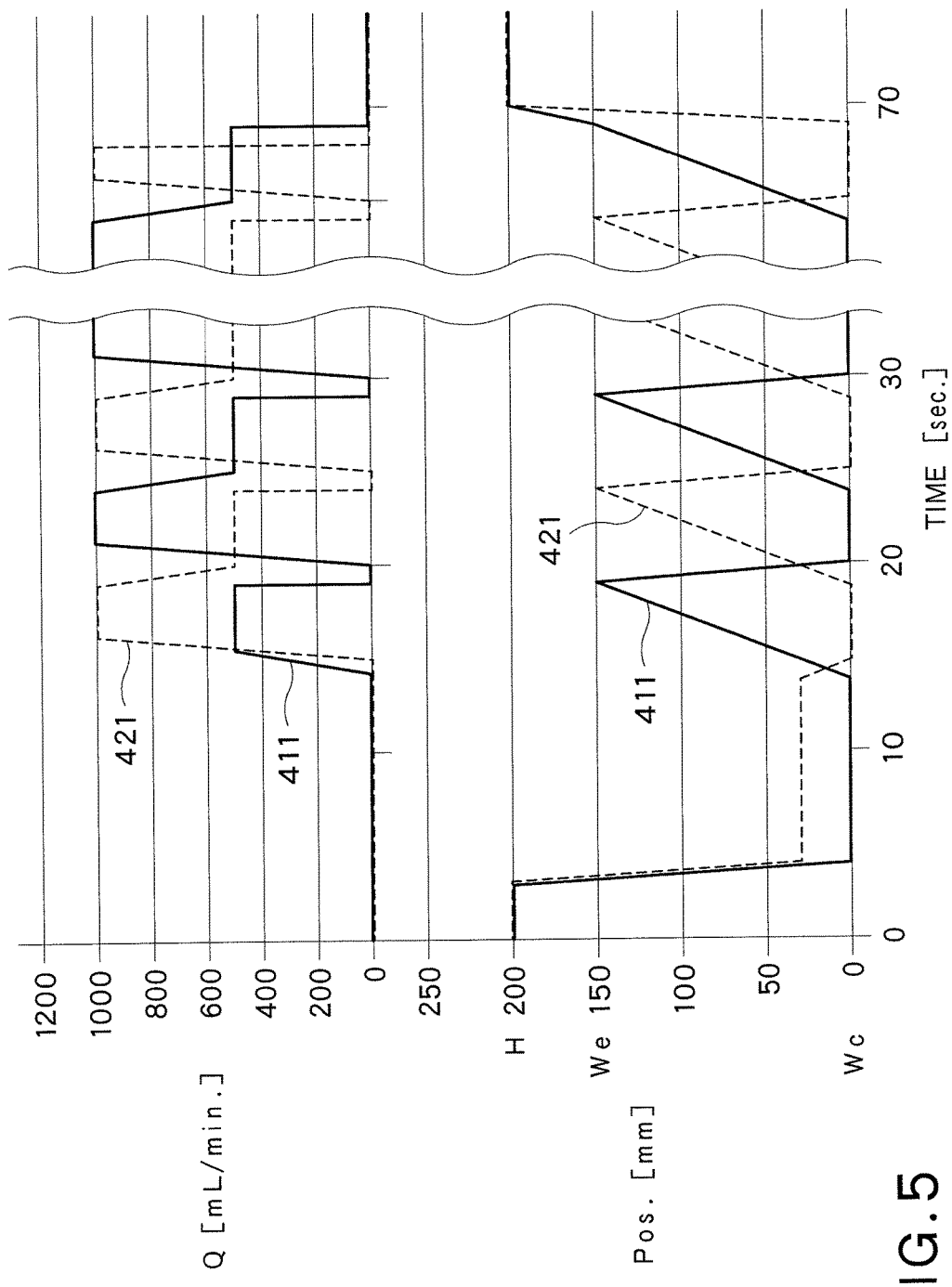
FIG. 5 is a timing chart for explaining the operation of the treatment liquid nozzles in a polymer removing step.

FIGS. 4A to 4E are explanatory diagrams for explaining the operation of the treatment liquid nozzles 411 and 421. FIG. 5 is a timing chart showing the changes, with time, of the radial positions (Pos (unit: mm)) of the treatment liquid nozzles 411 and 421 and discharge rates (Q (unit: ml/min)) of the polymer removing liquid discharged from the treatment liquid nozzles 411 and 421. In FIG. 5, each of the positions (Pos) of the treatment liquid nozzles 411 and 412 is indicated by the distance from the center (Wc) of a wafer W. Namely, 0 mm position means that the nozzle is located right above the center of a wafer, 150 mm position means that the nozzle is located right above the periphery of the wafer W (12-inch wafer), and 200 mm position means that the nozzle is located at a home position (standby position) (H) that is radially outward the periphery of the wafer. In FIG. 5, the position and the discharge rate of the treatment liquid nozzle 411 are shown by solid lines, and the position and the discharge rate of the treatment liquid nozzle 421 are shown by broken lines.

Firstly, a wafer W is carried into the chamber 20 of the treatment unit 16 by the substrate transfer device 17 (see FIG. 1), and the wafer W is held by the holding unit 31 of the substrate holding mechanism 30. Then, the wafer W held by the holding unit 31 is rotated about the vertical axis by the driving unit 33 of the substrate holding mechanism 30. The rotation of the wafer W is continued until a series of treatment steps to the wafer W are completed.

The first treatment liquid nozzle 411 is moved from the home position so as to be located at a position above (right above) the center of the wafer W. In addition, the second treatment liquid nozzle 421 is located at a position above the central portion of the wafer W (a position slightly distant from the position above the center in the horizontal direction) where the second treatment liquid nozzle 421 is not in contact with the first treatment liquid nozzle 411 but is adjacent to the first treatment liquid nozzle 411 (See FIG. 4A and a part around 14 seconds in FIG. 5). Herein, the "central portion of the wafer W" means an area of some extent including the "center of the wafer W" as a rotating center point of the wafer W. In the description of the operation, the movements of the first treatment liquid nozzle 411 and the second treatment nozzle 421 are achieved by turning the first nozzle arm 41 and the second nozzle arm 42.

Then, the first treatment liquid nozzle 411 starts discharging the polymer removing liquid at a small discharge rate (e.g., 500 ml/min), and the first treatment liquid nozzle 411 is started to be moved toward a position above the peripheral portion of the wafer W. Namely, the first treatment liquid nozzle 411 discharges the polymer removing liquid such that a falling point of the polymer removing liquid onto the wafer surface is firstly the center of the wafer W, and thereafter the first treatment liquid nozzle 411 is moved such that the falling point of the polymer removing liquid moves toward the peripheral portion of the wafer W. Simultaneously with the start of movement of the first treatment liquid nozzle 411 from the position above the center of the wafer W, the second treatment liquid nozzle 421 is moved to a position above the center of the wafer and is stopped thereat. Almost simultaneously with the stop, the second treatment liquid nozzle 421 starts discharging the polymer removing liquid at a large discharge rate (e.g., 1000 ml/min). Namely, at this time, the second treatment liquid nozzle 421 discharges the polymer removing liquid such that the falling point of the polymer removing liquid is the center of the wafer W (See FIG. 4B and a part around 15 seconds in FIG. 5).

The polymer removing liquid supplied to the surface of the wafer W from the first treatment liquid nozzle 411 and the second treatment liquid nozzle 421 flows to spread out to the peripheral portion of the wafer W by centrifugal force, so that the whole surface of the wafer W is covered with a liquid film of the polymer removing liquid. Polymers adhering to the surface of the wafer W are removed by the polymer removing liquid, and the removed polymers together with the polymer removing liquid scatter outside the periphery of the wafer W.

After the first treatment liquid nozzle 411 has reached the position above the peripheral portion of the wafer W (i.e., after the falling point of the polymer removing liquid from the first treatment liquid nozzle 411 has reached the peripheral portion of the wafer W), the discharge of the polymer removing liquid from the first treatment liquid nozzle 411 is stopped. Immediately thereafter, the first treatment liquid nozzle 411 is moved toward the position above the center of the wafer W (See FIG. 4C and a part around 18 seconds in FIG. 5).

Immediately before the first treatment liquid nozzle 411 reaches the position above the center of the wafer W (namely, immediately before the first treatment liquid nozzle 411 collides with the second treatment liquid nozzle 421 located above the center of the wafer W), the second treatment liquid nozzle 421 starts moving toward a position above the peripheral portion of the wafer W. Almost simultaneously with the start of movement, the discharge rate of the polymer removing liquid from the second treatment liquid nozzle 421 (which is large until then) is reduced to a small discharge rate. After the first treatment liquid nozzle 421 has reached the position above the center of the wafer W, the first treatment liquid nozzle 421 is stopped thereat. Almost simultaneously with the stop, the first treatment liquid nozzle 421 starts discharging the polymer removing liquid at the large discharge rate (See FIG. 4D and a part around 20 seconds in FIG. 5).

Figure 6:
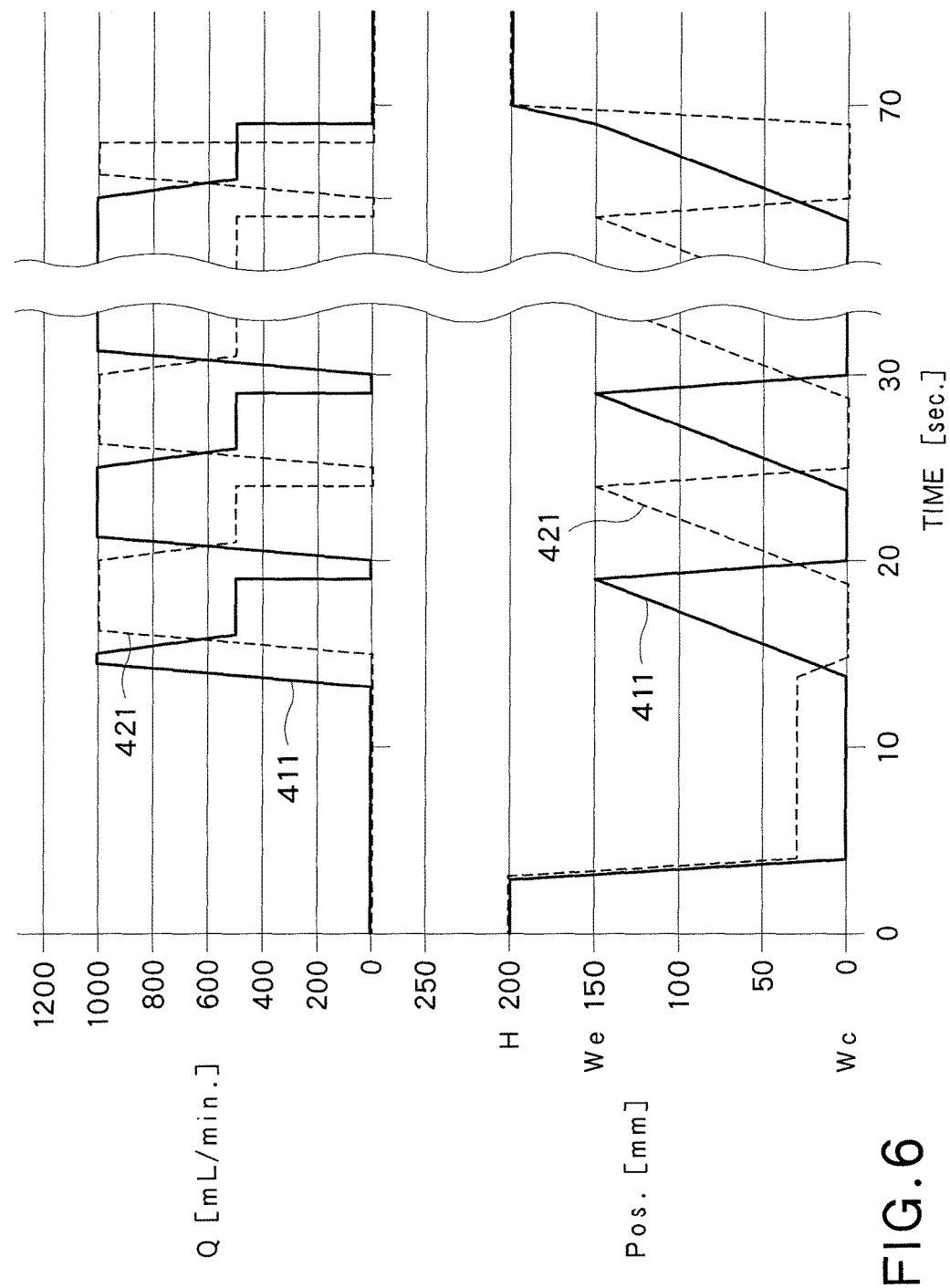
FIG. 6 is a timing chart for explaining the operation of the treatment liquid nozzles in a polymer removing step in one modification.

As shown in the timing chart of FIG. 6, during a period from a time point when the second treatment liquid nozzle 421 starts moving to a position above the peripheral portion of the wafer W up to a time point when the first treatment liquid nozzle 411 reaches the wafer center (referred to as "replacement period" for the sake of simplicity), the discharge rate of the polymer removing liquid from the second treatment liquid nozzle 421 may be maintained at the large discharge rate, and the discharge rate of the polymer removing liquid from the second treatment liquid nozzle 421 may be reduced to the small discharge rate after the first treatment liquid nozzle 411 has reached the wafer center. This reliably prevents the situation where the liquid film of the polymer removing liquid does not exist around the wafer center during the replacement period. Namely, during the replacement period, the polymer removing liquid is not directly supplied to the center of the wafer W from both of the first treatment liquid nozzle 411 and the second treatment liquid nozzle 421, but the polymer removing liquid supplied from the second treatment liquid nozzle 421 to a position radially outside the center of the wafer W spreads toward the wafer center, so that the center of the wafer W is covered with the liquid film of the polymer removing liquid. If the surface of the wafer W is hydrophobic, the polymer removing liquid is unlikely to spread toward the wafer center, and the liquid film of the polymer removing liquid thus is unlikely present around the center of the wafer. However, by increasing the discharge rate of the second treatment liquid nozzle 421, the polymer removing liquid is forced to spread toward the wafer center by the momentum of liquid flow, whereby a part around the wafer center can be covered with the liquid film of the polymer removing liquid.

After the second treatment liquid nozzle 421 has reached the position above the peripheral portion of the wafer W, the discharge of polymer removing liquid from the second treatment liquid nozzle 421 is stopped. Immediately thereafter, the second treatment liquid nozzle 421 is moved to the position above the center of the wafer W (See FIG. 4E and a part around 24 seconds in FIG. 5 about the above steps).

Immediately before the second treatment liquid nozzle 421 reaches the position above the center of the wafer W (namely, immediately before the second treatment liquid nozzle 421 collides with the first treatment liquid nozzle 411 located at the position above the center of the wafer W), the first treatment liquid nozzle 411 starts moving to the potion above the peripheral portion of the wafer W. Almost simultaneously with the start of movement, the discharge rate of the polymer removing liquid from the first treatment liquid nozzle 411 (which is large rate until then) is reduced to the small discharge rate. At a time point slightly before the first treatment liquid nozzle 411 reaches the position above the center of the wafer W, the second treatment liquid nozzle 421 located at the position above the center of the wafer W starts moving toward the peripheral portion of the wafer W, and the discharge rate of the polymer removing liquid from the second treatment liquid nozzle 421 is reduced to the small discharge rate (see a part around 25 seconds in FIG. 5).

As can be understood from the above description, the first treatment liquid nozzle 411 and the second treatment liquid nozzle 421 supply the polymer removing liquid to the wafer W, while alternatingly swapping their roles.

After the supply of the polymer removing liquid from the first treatment liquid nozzle 411 and the second treatment liquid nozzle 421 has been respectively carried out for a predetermined period of time, a rinse process is performed by supplying DIW as a rinse liquid from the rinse nozzle 412.

Specifically, for example, after the second treatment liquid nozzle 421 discharging the polymer removing liquid has reached the peripheral portion of the wafer W while the first treatment liquid nozzle 411 supplying the polymer removing liquid to the center of the wafer W, the discharge of the polymer removing liquid from the second treatment liquid nozzle 421 is stopped. Then, instead of moving the second treatment liquid nozzle 421 toward the center of the wafer W, the second treatment liquid nozzle 421 is retracted to the home position. Then, the rinse nozzle 412 is moved to a position above the center of the wafer W and is fixed thereat, and the discharge of DIW from the rinse nozzle 412 is started. Immediately thereafter, the discharge of the polymer removing liquid from the first treatment liquid nozzle 411 is stopped. The polymer removing liquid and reaction products or the like remaining on the wafer W are removed by the DIW supplied from the rinse nozzle 412.

As shown in the timing chart of FIG. 5, after completion of the final discharge of the polymer removing liquid from the first treatment liquid nozzle 411 and the 422 (see a part around 68 to 70 seconds in FIG. 5), both of the nozzles 411 and 421 may be returned once to the home position. In this case, DIW is supplied to the wafer surface from another nozzle (not shown) to prevent the surface of the wafer W from being dried.

After DIW has been supplied to the wafer W from the rinse nozzle 412 for a predetermined period of time, the solvent nozzle 413 is moved to a position above the center of the wafer W and is fixed thereat, and discharge of IPA from the solvent nozzle 413 is started. Immediately thereafter, the discharge of DIW from the rinse nozzle 412 is stopped. The DIW on the wafer W is replaced with the IPA supplied thereto from the solvent nozzle 413.

Then, the second nozzle arm 42 is turned to move the dry gas nozzle 422 to a position above the center of the wafer W. At a time point slightly before the dry gas nozzle 422 reaches the position above the center of the wafer W, the first nozzle arm 41 is turned to move the solvent nozzle 413, which is located at the position above the center of the wafer W, toward the peripheral portion of the wafer W. After the dry gas nozzle 422 has reached the position above the center of the wafer W, discharge of nitrogen gas from the dry gas nozzle 422 is started, and the dry gas nozzle 422 is moved toward the peripheral portion of the wafer W. The solvent nozzle 413 and the dry gas nozzle 422 are moved toward the peripheral portion of the wafer W such that the collision point, on the surface of the wafer W, of the nitrogen gas discharged from the dry gas nozzle 422 is maintained radially inside the falling point, on the surface of the wafer W, of IPA discharged from the solvent nozzle 413. Thus, the dried area on the surface of the wafer W gradually spreads outward, and finally, the whole surface of the wafer W dries. In this manner, a series of steps for removing polymer is completed.

In the foregoing embodiment, there are provided two nozzles (i.e., the first treatment liquid nozzle 411 and the second treatment liquid nozzle 422) that discharge the heated polymer removing liquid and are capable of moving independently from each other. The falling point of the polymer removing liquid from one nozzle (the nozzle remaining stationary above the central portion of the wafer is referred to as "nozzle 1" herebelow for the sake of simplicity) of the two nozzles onto the wafer surface is fixed at the central portion of the wafer, while the falling point of the polymer removing liquid from the other nozzle (the moving nozzle is referred to as "nozzle 2" herebelow for the sake of simplicity) is moved from the central portion to the peripheral portion.

Thus, since the polymer removing liquid is continuously supplied from the nozzle 1 to the wafer central portion, there is no possibility that an area not covered with the polymer removing liquid (i.e., an area that is exposed to the wafer surrounding atmosphere) is generated in the central portion of the wafer surface.

In addition, since the falling point of the polymer removing liquid discharged from the nozzle 2 is moved to the wafer peripheral portion, the polymer present on the wafer surface is pushed out toward the wafer peripheral portion. Thus, the polymer having peeled off from the wafer surface can be efficiently expelled from the wafer surface.

Further, since the heated polymer removing liquid is supplied from the nozzle 2 with the falling point moving from the central portion toward the peripheral portion of the wafer, uniformity, with respect to the radial direction of the wafer W, of both the wafer surface temperature and the temperature of the polymer removing liquid in contact with the wafer surface are improved. Thus, in-plane uniformity of the polymer removing treatment can be improved.

Moreover, since the polymer removing liquid discharged from the nozzle 2 applies a downward force to the liquid film formed by the polymer removing liquid that has been discharged from the nozzle 1 to the wafer central portion and then flows toward the peripheral portion, the polymer removing liquid discharged from the nozzle 2 pushes the polymer removing liquid forming the liquid film into recesses in a pattern. Thus, polymers present in the recesses in the pattern located radially outside the central portion of the wafer can be efficiently removed.

If the nozzle 2 discharges the polymer removing liquid with the falling point onto the wafer surface moving from the peripheral portion to the central portion, the polymer removing liquid, which has been discharged from the nozzle 1 to the wafer central portion and is flowing toward the peripheral portion while forming a liquid film on the wafer surface, is pushed back toward the wafer central portion. This may increase the possibility that polymers once peeled off from the wafer surface adhere to the wafer surface again. Moreover, the flow of polymer removing liquid (which has been supplied from the nozzle 1 to the wafer central portion and is flowing toward the wafer peripheral portion) and the flow of the polymer removing liquid discharged from the nozzle 2 violently collide with each other, whereby a big splash occurs. On the other hand, in the foregoing embodiment, since the nozzle 2 is discharging no polymer removing liquid when the nozzle 2 is returning to the position above the wafer central portion, the foregoing problems do not occur.

In addition, in the foregoing embodiment, a larger part of the total discharge rates of the nozzles 1 and 2 is distributed to the nozzle 1, when the nozzles 1 and 2 are simultaneously discharging the polymer removing liquid. Namely, the discharge rate of the nozzle 2 that is moving to move the falling point of the polymer removing liquid from the wafer central portion to the wafer peripheral portion is smaller than the discharge rate of the nozzle 1 that is supplying the polymer removing liquid fixedly onto the wafer central portion. Thus, the flow of the treatment liquid toward the wafer peripheral portion is not likely to be disturbed regardless of the falling position of the polymer removing liquid from the nozzle 2. Thus, the whole surface of the wafer can be reliably covered with the polymer removing liquid.

In the forgoing embodiment, the roles of the two nozzles (i.e., the first treatment liquid nozzle 411 and the second treatment liquid nozzle 421) are swapped alternatingly. However, not limited thereto, one of the nozzles, e.g., the first treatment liquid nozzle 411 may have only the role for supplying the polymer removing liquid to the wafer central portion, and the other nozzle, e.g., the second treatment liquid nozzle 421 may have only the role for discharging the polymer removing liquid with the falling point onto the wafer surface moving from the central portion toward the peripheral portion. In this case, the one nozzle 411 does not need to be held by the first nozzle arm 41 the movement of which is controlled by the control unit 18 during the supply of the polymer removing liquid. To be specific, the operation may be as follows: when the control unit 18 makes the first treatment liquid nozzle 411 supply the polymer removing liquid therefrom to the wafer central portion, the control unit 18 makes the second treatment liquid nozzle 421 move from the central portion to the peripheral portion of the wafer and makes the second treatment liquid nozzle 421 supply the polymer removing liquid therefrom; thereafter the control unit 18 makes the second treatment liquid nozzle 421 stop discharging the polymer removing liquid therefrom and makes the second treatment liquid nozzle 421 move from the peripheral portion to the central portion of the wafer, while making the first nozzle 411 supply the polymer removing liquid therefrom; and thereafter the control unit 18 makes the second treatment liquid nozzle 421 start supplying the polymer removing liquid therefrom to the wafer and makes the second treatment liquid nozzle 421 move from the central portion to the peripheral portion of the wafer, while making the first treatment liquid nozzle 411 supply the polymer removing liquid therefrom. In addition, the first treatment liquid nozzle 411 may be fixedly mounted to a position within the chamber 20, e.g., a position outside the liquid receiving cup 50. In this case, the polymer removing liquid discharged from the fixed nozzle reaches the center of the wafer W across the space above the wafer W.

In the foregoing embodiment, although the treatment liquid to be discharged from the two treatment liquid nozzles is the polymer removing liquid. However, the treatment liquid is not limited to the polymer removing liquid, but may be a liquid other than the polymer removing liquid, such as a cleaning liquid or an etchant. Also in this case, substances having been removed from the wafer surface by cleaning or etching can be prevented from adhering again to the surface of the wafer W, while the occurrence of situation, where the liquid film on the wafer central portion is lost and the wafer central portion is exposed to the wafer surrounding atmosphere, is prevented. Further, in-plane uniformity of the thermal condition within the wafer surface is improved, so that in-plane uniformity of the cleaning process and the etching process can be improved.

In the foregoing embodiment, although the treatment liquid to be discharged from the two treatment liquid nozzles is heated, the treatment liquid may have normal temperature. Also in this case, substances once having been removed from the wafer surface by cleaning or etching can be prevented from adhering again to the surface of the wafer W, while the occurrence of situation, where the liquid film on the wafer central portion is lost and the wafer central portion is exposed to the wafer surrounding atmosphere, is prevented.

A substrate to be processed is not limited to a semiconductor wafer W, and may be another substrate such as a glass substrate, a ceramic substrate, etc.

The invention claimed is:

1. A substrate liquid treatment apparatus comprising:
   a substrate holding unit that holds a substrate;
   a rotary driving unit that rotates the substrate holding unit about a vertical axis;
   a first nozzle that supplies a treatment liquid at least onto a central portion of the substrate held by the substrate holding unit;
   a second nozzle that supplies the treatment liquid onto the substrate held by the substrate holding unit;
   a first liquid supplying unit that supplies the treatment liquid to the first nozzle;
   a second liquid supplying unit that supplies the treatment liquid to the second nozzle;
   a second nozzle moving mechanism that moves the second nozzle between the central portion and a peripheral portion of the substrate held by the substrate holding unit; and
   a control unit that controls operations at least of the first liquid supplying unit, the second liquid supplying unit and the second nozzle moving mechanism,
   wherein the control unit is configured to:
   make the second nozzle move from the central portion toward the peripheral portion of the substrate while making the second nozzle supply the treatment liquid therefrom and while making the first nozzle supply therefrom the treatment liquid to the central portion of the substrate;
   thereafter make the second nozzle move from the peripheral portion toward the central portion of the substrate while making the second nozzle stop supplying the treatment liquid therefrom, while making the first nozzle supply the treatment liquid therefrom; and
   thereafter make the second nozzle start supplying the treatment liquid while making the first nozzle supply the treatment liquid therefrom.

2. The substrate liquid treatment apparatus according to claim 1, further comprising a first nozzle moving mechanism that moves the first nozzle between the central portion and the peripheral portion of the substrate held by the substrate holding unit,
   wherein the control unit is also configured to control the first nozzle moving mechanism, and
   wherein the control unit is configured to: make the first nozzle supply the treatment liquid therefrom while making the first nozzle move from the central portion to the peripheral portion of the substrate, and while making the second nozzle supply the treatment liquid to the central portion of the substrate, after the second nozzle has moved from the peripheral portion to the central portion of the substrate and has started the supplying of the treatment liquid; thereafter make the first nozzle stop supplying the treatment liquid and make the first nozzle without supplying the treatment liquid move from the peripheral portion toward the central portion of the substrate, while making the second nozzle supply the treatment liquid therefrom; and thereafter make the first nozzle start supplying therefrom the treatment liquid to the substrate while making the second nozzle supply the treatment liquid therefrom.

3. The substrate liquid treatment apparatus according to claim 1,
   wherein the control unit is configured to make second nozzle move from the central portion toward the peripheral portion of the substrate while making the second nozzle supply the treatment liquid, while making the first nozzle supply the treatment liquid to the central portion of the substrate, after the second nozzle has moved from the peripheral portion to the central portion of the substrate and has started the supplying of the treatment liquid.

4. The substrate liquid treatment apparatus according to claim 2,
   wherein the control unit is configured to control a treatment liquid supply rate at which the second nozzle is supplying the treatment liquid to the central portion of the substrate so as to be larger than a treatment liquid supply rate at which the second nozzle is supplying the treatment liquid while moving from the central portion to the peripheral portion of the substrate.

5. The substrate liquid treatment apparatus according to claim 2, wherein:
   the control unit is configured to control a treatment liquid supply rate at which the second nozzle is supplying the treatment liquid to the central portion of the substrate so as to be larger than a treatment liquid supply rate at which the second nozzle is supplying the treatment liquid while moving from the central portion to the peripheral portion of the substrate; and the control unit is configured to control a treatment liquid supply rate at which the first nozzle is supplying the treatment liquid to the central portion of the substrate so as to be larger than a treatment liquid supply rate at which the first nozzle is supplying the treatment liquid while moving from the central portion to the peripheral portion of the substrate.

6. The substrate liquid treatment apparatus according to claim 5, wherein the control unit is configured to lower a treatment liquid supply rate at which the first nozzle is supplying the treatment liquid, after the first nozzle has started to move from the central portion toward the peripheral portion of the substrate.

7. The substrate liquid treatment apparatus according to claim 1, wherein the control unit is configured to control a moving speed at which the second nozzle is moving from the peripheral portion toward the central portion of the substrate so as to be higher than a moving speed at which the second nozzle is moving from the central portion toward the peripheral portion of the substrate.

8. The substrate liquid treatment apparatus according to claim 2, wherein:

wherein the control unit is configured to control a moving speed at which the second nozzle is moving from the peripheral portion toward the central portion of the substrate so as to be higher than a moving speed at which the second nozzle is moving from the central portion toward the peripheral portion of the substrate; and wherein the control unit is configured to control a moving speed at which the first nozzle is moving from the peripheral portion toward the central portion of the substrate so as to be higher than a moving speed at which the first nozzle is moving from the central portion toward the peripheral portion of the substrate.

9. A substrate liquid treatment method employing a substrate liquid treatment apparatus including:

a substrate holding unit that holds a substrate;

a rotary driving unit that rotates the substrate holding unit about an vertical axis;

a first nozzle that supplies a treatment liquid at least onto a central portion of the substrate held by the substrate holding unit;

a second nozzle that supplies the treatment liquid onto the substrate held by the substrate holding unit;

a first liquid supplying unit that supplies the treatment liquid to the first nozzle;

a second liquid supplying unit that supplies the treatment liquid to the second nozzle; and a second nozzle moving mechanism that moves the second nozzle between the central portion and a peripheral portion of the substrate held by the substrate holding unit, said substrate liquid treatment method comprising:

(a) rotating the substrate about the vertical axis;

(b) supplying the treatment liquid to the rotating substrate from the second nozzle with a falling point of the treatment liquid supplied from the second nozzle moving from the central portion to the peripheral portion of the substrate, while supplying the treatment liquid to the central portion of the substrate from the first nozzle;

(c) after (b), moving the second nozzle from the peripheral portion to the central portion of the substrate with the supplying of the treatment liquid from the second nozzle being stopped, while continuing supplying the treatment liquid to the central portion of the rotating substrate from the first nozzle; and (d) after (c), supplying the treatment liquid to the rotating substrate from the second nozzle.

10. The substrate liquid treatment method according to claim 9, further comprising:

(e) after (d), supplying the treatment liquid to the rotating substrate from the first nozzle with a falling point of the treatment liquid supplied from the first nozzle moving from the central portion to the peripheral portion of the substrate, while supplying the treatment liquid to the central portion of the substrate from the second nozzle.

11. The substrate liquid treatment method according to claim 9, further comprising:

(f) after (d), supplying the treatment liquid to the rotating substrate from the second nozzle with a falling point of the treatment liquid supplied from the second nozzle moving from the central portion to the peripheral portion of the substrate, while continuing supplying the treatment liquid to the central portion of the substrate from the first nozzle.

12. The substrate liquid treatment method according to claim 10, wherein:

a treatment liquid supply rate at which the second nozzle is supplying the treatment liquid to the central portion of the substrate is controlled so as to be larger than a treatment liquid supply rate at which the second nozzle is supplying the treatment liquid while moving from the central portion to the peripheral portion of the substrate; and a treatment liquid supply rate at which the first nozzle is supplying the treatment liquid to the central portion of the substrate is controlled so as to be larger than a treatment liquid supply rate at which the first nozzle is supplying the treatment liquid while moving from the central portion to the peripheral portion of the substrate.

13. The substrate liquid treatment method according to claim 9, wherein the treatment liquid has a temperature higher than normal temperature.

14. The substrate liquid treatment method according to claim 9, wherein the treatment liquid is a cleaning liquid or an etching liquid.

15. A non-transitory storage medium storing a program configured such that, upon execution of which by a computer for controlling operations of a substrate liquid treatment apparatus, the computer controls the substrate liquid treatment apparatus to perform the substrate liquid treatment method according to claim 9.

* * * * *